United States Patent [19]
Esterowitz et al.

[11] Patent Number: 5,268,920
[45] Date of Patent: Dec. 7, 1993

[54] SYSTEM FOR END-PUMPING A SOLID STATE LASER USING A LARGE APERTURE LASER DIODE BAR

[75] Inventors: Leon Esterowitz, Springfield; Robert C. Stoneman; James G. Lynn, both of Alexandria, all of Va.

[73] Assignee: The United States of America as represented by the Secretary of the Navy, Washington, D.C.

[21] Appl. No.: 788,674

[22] Filed: Nov. 6, 1991

[51] Int. Cl.[5] .................. H01S 3/091; H01S 3/092
[52] U.S. Cl. ...................................... 372/71; 372/101
[58] Field of Search ................................ 372/71, 101

[56] References Cited

U.S. PATENT DOCUMENTS 4,794,615  12/1988  Berger et al. ..................... 372/71
5,130,996   7/1992  Amano et al. ..................... 372/71

OTHER PUBLICATIONS

Publication, Laser Diode Pumped 1-W CW Green Laser, by M. Oka et al., Conference on Lasers and Electro-Optics, 1990 Technical Digest Series, vol. 7, 21-25, May 1990, Anaheim, Ca., Paper CWC5, 1990.

*Primary Examiner*—Rodney B. Bovernick
*Assistant Examiner*—Robert E. Wise
*Attorney, Agent, or Firm*—Thomas E. McDonnell; George Jameson

[57] ABSTRACT

An optical system for end-pumping the gain medium of a three-level or a self-terminating solid state laser with the optical output from a wide aperture laser diode bar is disclosed. In a preferred embodiment, the optical system includes: a laser diode bar for emitting from an elongated emissive area thereof a bright light having a lateral divergence and a transverse divergence; and an optical assembly disposed between the laser diode bar and the three-level solid state laser for collecting and focusing the bright light into a relatively small high-intensity spot to end-pump the gain medium of the three-level or self-terminating solid state laser.

19 Claims, 3 Drawing Sheets

SYSTEM FOR END-PUMPING A SOLID STATE LASER USING A LARGE APERTURE LASER DIODE BAR

BACKGROUND OF THE INVENTION

1. Field of the Invention

The present invention relates to lasers and particularly to a system for focusing the output of a long aperture laser diode bar into a small, high intensity spot to end pump a solid state laser.

2. Description of the Prior Art

There is currently considerable interest in lasers capable of generating near-infrared radiation for medical and remote sensing applications. One laser operating in this region is the 2 $\mu$m $Tm^{3+}$ $^3F_4 \rightarrow {}^3H_6$ system. The strong $^3H_6 \rightarrow {}^3H_4$ absorption at 785 nm coincides with the emissions of recently available, high-power laser diode bars. Thus this laser can take advantage of the size, weight, reliability and efficiency benefits offered by laser diode pumping. However, the 2 $\mu$m $Tm^{3+}$ $^3F_4 \rightarrow {}^3H_6$ system is a three-level laser, and is therefore subject to special considerations.

In three-level lasers, every active ion within the laser mode volume either contributes gain if it is in the excited state, or loss if it is in the ground state. Hence, a three-level laser normally has a higher threshold than a comparable four-level laser system, where ground-state ions have negligible effect. While considerable effort has been invested in developing methods for using laser diode bars to pump four-level $Nd^{3+}$ $^3F_{3/2} \rightarrow {}^4I_{11/2}$ lasers, these configurations do not lend themselves well to three-level lasers and other systems exhibiting laser reabsorption losses.

Optimal side pumping requires a sufficiently high activator ion concentration to absorb much of the incident pump radiation and an active medium long enough to take advantage of the geometry of the pump source. The resultant, nearly-uniform, pump deposition across a laser rod requires a large laser mode volume to extract most of the stored energy from the rod. The large number of activator ions present within the mode volume results in such a high threshold for three-level systems that side-pumping with laser-diode bars may be practical only for very high-power lasers incorporating several tens of diode bars. The threshold can be lowered to a more easily attained level by reducing the activator ion concentration, which reduces the mode-matching and coupling efficiency, or by reducing the pump and laser mode volume, which is not easily reconciled with side pumping.

The poor spatial mode-matching and poor coupling efficiencies characteristic of workable laser-diode bar, side-pumped geometries, when considered in parallel with the high probability of re-absorption losses due to unpumped regions in the laser rod, and the higher threshold of three-level lasers, renders side-pumping with laser diodes impractical for most three-level lasers.

The excellent mode-matching afforded by end-pumping is particularly advantageous to three-level lasers for ensuring that all active ions within the laser mode volume are pumped, thus minimizing re-absorption losses. High-efficiency operation of a diode-pumped $Tm^{3+}$:YAG laser has been demonstrated in the prior art, but the output power is limited by the pump power available from the individual phased-array laser diodes needed to provide the high quality beam necessary for good mode matching. What is needed at the present time is a way to end-pump three-level lasers using high-power laser-diode bars.

OBJECTS OF THE INVENTION

Accordingly, one object of the invention is to provide a system for end-pumping a three-level solid state laser using a large aperture laser diode bar.

Another object of the invention is to provide an optical system for focusing the output of a large aperture laser diode bar into a small high-intensity spot to end-pump a solid state laser.

A further object of the invention is to provide an optical system for collecting and focusing the bright light from a laser diode bar into a relatively small, high-intensity spot to end-pump a three-level or self-terminating solid state laser.

SUMMARY OF THE INVENTION

These and other objects of the invention are achieved by providing an optical system for end-pumping the gain medium of a three-level or a self-terminating solid state laser with the optical output from a wide aperture laser diode bar. The optical system includes: a laser diode bar for emitting from an elongated emissive area thereof a bright light having a lateral divergence and a transverse divergence; and an optical assembly disposed between the laser diode bar and the three-level solid state laser for collecting and focusing the bright light into a relatively small high-intensity spot to end-pump the gain medium of the three-level or self-terminating solid state laser.

BRIEF DESCRIPTION OF THE DRAWINGS

These and other objects, features and advantages of the invention, as well as the invention itself, will become better understood by reference to the following detailed description when considered in connection with the accompanying drawings wherein like reference numerals designate identical or corresponding parts throughout the several views and wherein.

DETAILED DESCRIPTION OF THE PREFERRED EMBODIMENT

Figure 1:
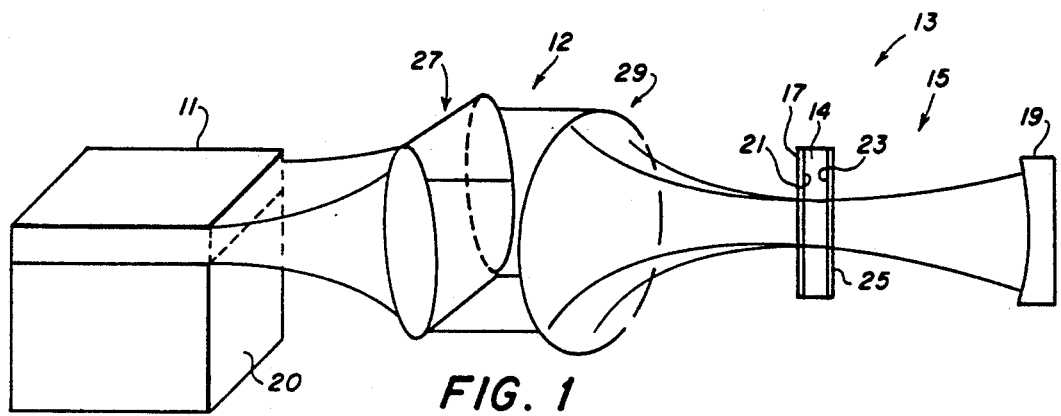
FIG. 1 is a simplified side view of a preferred embodiment of the invention.

Referring now to the drawings, FIG. 1 is a simplified side view of the invention in which the output bright light of a large aperture laser diode bar 11 is focused by a lens assembly 12 into a relatively high intensity spot to end-pump a solid state laser 13.

The solid state laser 13 is comprised of a laser rod or active or gain medium 14 disposed in a laser cavity 15 defined by optically-aligned input and output reflective elements of mirrors 17 and 19. Reflective elements 17 and 19 oppose each other on a common axis to form a reflective path therebetween.

For purposes of ease of understanding of this description, the active medium or laser rod 14 will be selected to be a 12% $Tm^{3+}$:YAG active medium, which enables the solid state laser 13 to produce a 2 μm output when it is pumped with a 785 nm pump beam from the laser diode bar 11. However, it should be understood that any selected one of other active mediums could be used. In such a case, a different laser diode bar 11 (as well as a different lens assembly 12) may have to be used to match the output wavelength of the laser diode bar 11 to the absorption band of the active medium or laser rod 14.

The laser rod 14, which can have a thickness between 0.25 mm and 25 mm (millimeters), has an exemplary thickness in this description of approximately 1 millimeters (mm) and also has flat and parallel surfaces 21 and 23. The input surface 21 of the laser rod 14 has a dichroic coating which operates as the input reflective element or mirror 17. However, it should be understood that the mirror 17 could be a separate mirror spaced apart from the laser rod 14. The dichroic coating or mirror 17 has a high transmission (over 76%) at the pump wavelength of 785 nm and a high reflection (about 99%) at a wavelength of about 2 microns. The second surface 23 of the laser rod 14 has an anti-reflection coating 25 at about 2 microns.

The output reflective element or mirror 19, which defines the output end of the laser cavity 15, is concave and has an exemplary 10 centimeter (cm) radius of curvature. This output mirror 19, which is about 99.5% reflective at about 2 microns, is positioned about 9 cm away from the reflector 17 and serves as an output coupler to output a portion of the laser emission developed by the laser rod 14 when it is pumped by the 785 nm pulsed laser emission from the laser diode bar 11. The resulting cavity beam waist is 280 μm in diameter.

A typical high power laser diode bar 11 which produces a pulsed, 50 watt, 785 nm output which may be used to end pump the solid state laser 13 is a SDL-3240 laser diode bar manufactured by Spectra Diode Laboratories of San Jose, Calif. With such a high power, laser diode bar 11 used in FIG. 1, a heat sink 20 may be used to cool the laser diode bar 11.

The laser diode bar 11 is typically very small—about 1 cm long, a few 100 microns tall and about 1 mm wide. Along the face of the laser diode bar 11, that is about 1 cm long and about a few 100 microns tall, there are about 20 laser diode arrays (not shown), with each laser diode array containing about 30 laser diodes. All of the laser diodes in all of the arrays are mounted in a line of what amounts to a linear source of 600 laser diodes. All of these diodes are simultaneously pulsed by their power supply (not shown) to produce about 500 microsecond long pulses of light at a combined output power of about 50 watts. The laser diode bar 11 emits no light when it is not pulsed by its power supply.

Each individual laser diode in the laser diode bar 11 emits a two-lobe pattern (not shown), With light coming out of the two lobes. The two lobes of each of the 600 laser diodes are all in the same plane as defined by the line of the 600 laser diodes and the direction of emission. The centers between two lobes from a given laser diode are longitudinally (or laterally) separated from each other by about 10 degrees, with each of the two lobes having a width or lateral divergence of about 4 degrees. In the orthogonal (or transverse) direction, each of the 1200 lobes has a divergence of about 45 degree full width at half maximum. All of the 1200 beams or lobes have about the same lateral and transverse divergences. Thus, the laser diode bar Il appears to produce from an elongated area thereof an output bright light with given lateral and transverse divergences.

The lens assembly 12 utilizes a large numerical aperture, compound cylindrical lens 27 to collimate the output of the laser diode bar 11 in the large-divergence (fast axis) direction, which is perpendicular to the electric vector and perpendicular to the axis of the laser rod 14. The lens assembly 12 then utilizes a compound spherical lens 29 to focus the collimated beam to a small high intensity spot, which is shown as FOCAL POINT A in each of FIGS. 2A and 2B.

Figures 2A, 2B:
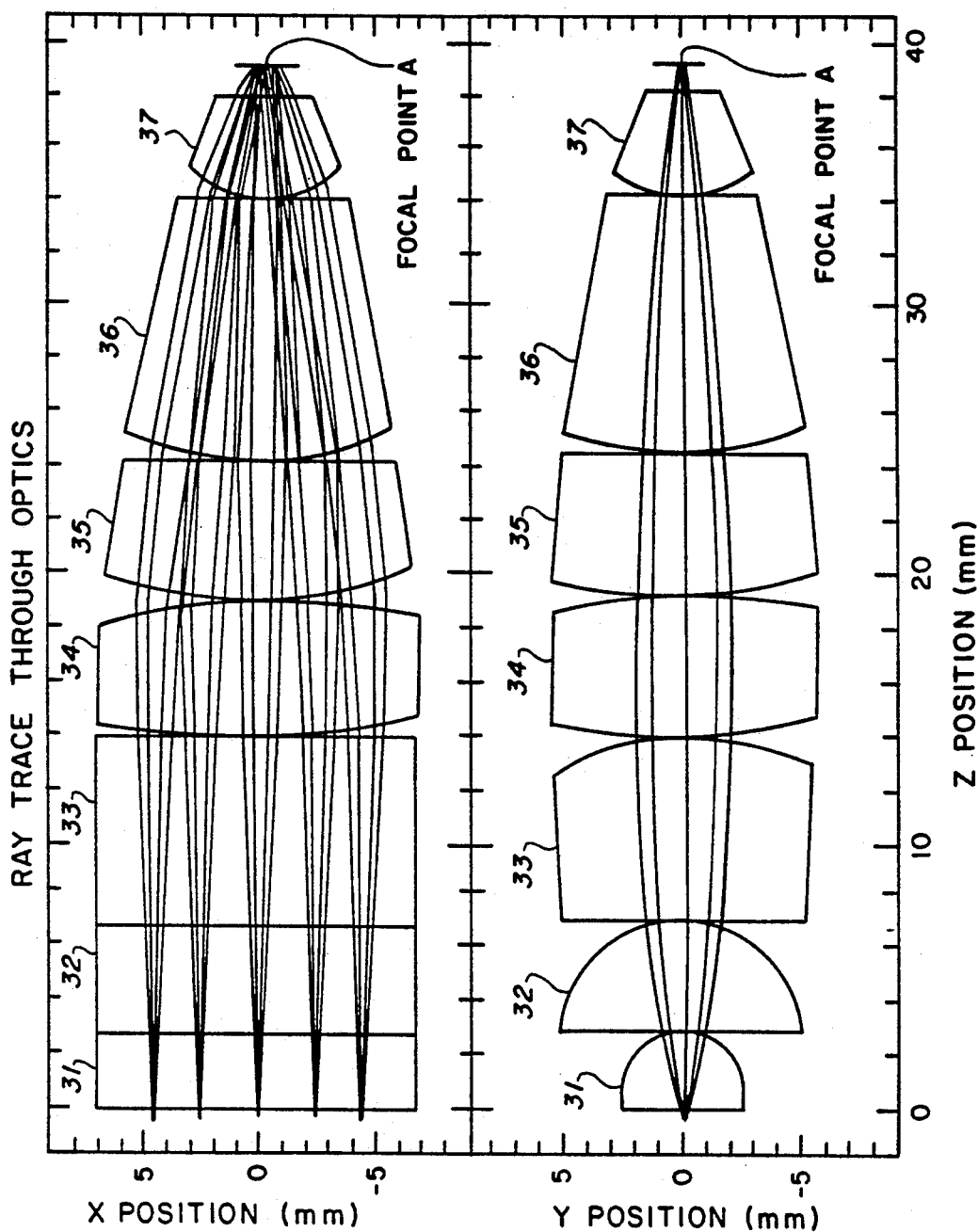
FIGS. 2A and 2B respectively represent top and side views of exemplary optical lenses which may be utilized in the optical assembly of FIG. 1.

Referring now to FIGS. 2A and 2B, the lens assembly 12 will be discussed in greater detail. The specific problem that the lens assembly 12 has to solve is to collect all of the light from the 1200 lobes of the 600 individual diodes in the laser diode bar 11 and focus all of that light into a small high intensity spot. It should be noted at this time that FIGS. 2A and 2B are drawings of the ray trace through the optics of the lens assembly 12. Only the two-lobe outputs of five of the 600 laser diodes in the laser diode bar 11 are shown in FIGS. 2A and 2B for the sake of clarity. However, it should be understood that substantially all of the two-lobe outputs of the 600 laser diodes in the laser diode bar 11 would pass through the optics shown in FIGS. 2A and 2B.

FIG. 2A is a top view of the ray trace through the optics of the lens assembly 12, showing the low-divergence (slow axis or 10 degree) direction. On the other hand, FIG. 2B is a side view of the ray trace through the optics of the lens assembly, showing the large or wide divergence (fast axis or 45 degree) direction, which is perpendicular to the electric vector and perpendicular to the axis of the laser rod 14. The 10 degree divergence shown in FIG. 2A is very small when compared to the 45 degree divergence shown in FIG. 2B. As a result, the elongated beam from the laser diode bar 11 is treated as already being substantially collimated in the low-divergence (slow axis or 10 degree) direction. On the other hand, no such assumption can be made for the 45 degree divergence shown in FIG. 2B. Consequently, cylindrical optics are used to collimate the elongated beam from the laser diode bar 11 in the large divergence (fast axis or 45 degree) direction shown in FIG. 2B. Then, as stated above, a compound spherical lens is calculated that will focus the resultant collimated beam to a small spot.

The configuration of the lens assembly 12 is then optimized, using a commercially available ray tracing package to produce the smallest spot from the elongated output of the laser diode bar 11. The model used to represent the laser diode bar 11 during optimization assumes that the laser diode bar 11 is a linear array of lasers, each radiating having a full width at half maximum (FWHM) of approximately 2 degrees in the slow direction and approximately 45 degrees in the fast direction. Although preliminary designs use arbitrary lenses, the final optimized version uses only commercially available lenses. Included are circular-cylinder plano-convex (PCX CYL) lenses 31, 32 and 33; spherical biconvex (BCX SPH) lens 34; and spherical plano-convex (PCX SPH) lenses 35, 36 and 37, as shown in FIGS. 2A and 2B. All of the lenses 31-37 of the lens assembly 12, as shown in FIGS. 2A and 2B, are anti-reflection coated for the wavelength region between 780 nm and 800 nm, and are held in place within an aluminum housing (not shown).

In operation, the lenses 31–37 collectively operate to collect and focus about 80% of the light from the laser diode bar 11 onto FOCAL POINT A. It should be noted at this time that the active medium 14 of solid state laser 13 is positioned at FOCAL POINT A to maximize the absorption by the active medium 14 of the 785 nm light from the laser diode bar 11. Additional information on the lenses 31–37 are shown in the following TABLE.

TABLE

| Lens Number | Type | Focal Length (in mm) | Dia. | Center Thickness | Company | Catalog Number | Coating |
|---|---|---|---|---|---|---|---|
| 31 | PCX CYL | 5.0 | 12.5 | 2.9 | Spindler & Hoyer | 063420 | Lightning Optical Corp. MLAR @ 785 nm |
| 32 | PCX CYL | 10.0 | 18.0 | 4.0 | Spindler & Hoyer | 063421 | Lightning Optical Corp. MLAR @ 785 nm |
| 33 | PCX CYL | 25.4 | 25.4 X22 | 7.0 | Melles Griot | 01LCP006 | Melles Griot/ 076 HEBBAR |
| 34 | BCX SPH | 50.0 | 25.0 | 5.1 | Melles Griot | 01LDX103 | Melles Griot/ 076 HEBBAR |
| 35 | PCX SPH | 50.8 | 25.4 | 5.2 | Melles Griot | 01LPX113 | Melles Griot 076 HEBBAR |
| 36 | PCX SPH | 35.0 | 25.4 | 9.6 | — | — | Lightning Optical Corp. MLAR @ 780–800 nm |
| 37 | PCX SPH | 10.0 | 8.0 | 3.9 | Melles Griot | 01LPX005 | Melles Griot/ 076 HEBBAR |

The address of Melles Griot is 1770 Kettering St., Irvine, Calif.

The address of Spindler & Hoyer is 459 Fortune Blvd. Milford, Mass.

The address of Lightning Optical Corp. is 131 Hibiscus St., Tarpon Springs, Fla.

Figure 3:
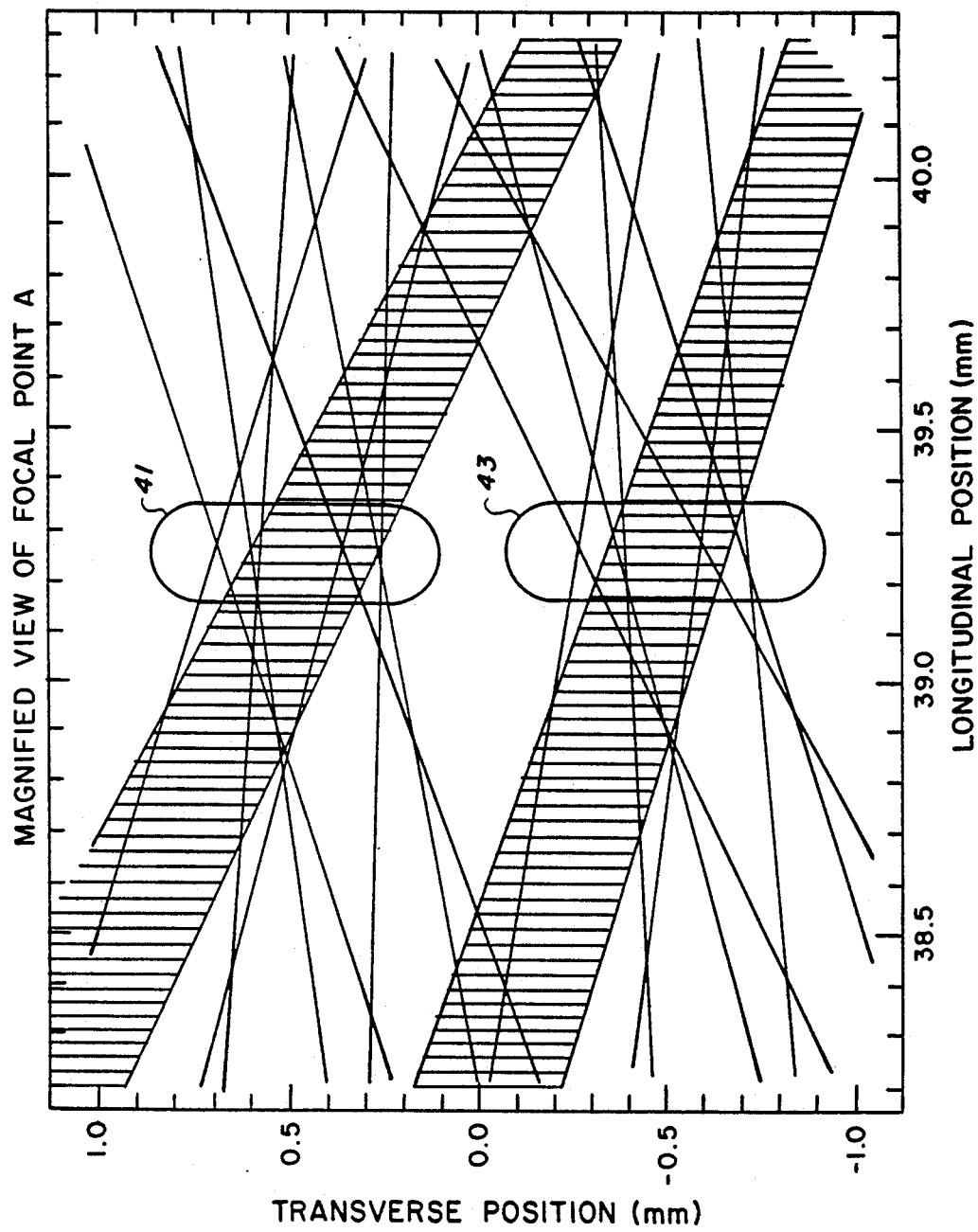
FIG. 3 is a magnified view of focal point A shown in FIGS. 2A and 2B.

FIG. 3 is a magnified view of FOCAL POINT A. The beams or lobes designated with vertical lines illustrate the two lobes of one of the 600 laser diodes in the laser diode bar 11. It should be noted that, by and large, the left lobes from all of the 600 laser diodes land substantially in the same place at the FOCAL POINT A, while the right lobes from all of the 600 laser diodes land substantially in the same place at the FOCAL POINT A. Thus, FIG. 3 indicates that the output of the laser diode bar 11 is to be focused into two spots 41 and 43 that are approximately 440 μm wide, approximately 110 μm thick, and separated by approximately 950 μm. This two-spot pattern arises from the two-lobed far-field patterns of each of the approximately 20 laser phased arrays in the laser diode bar 11.

Figure 4:
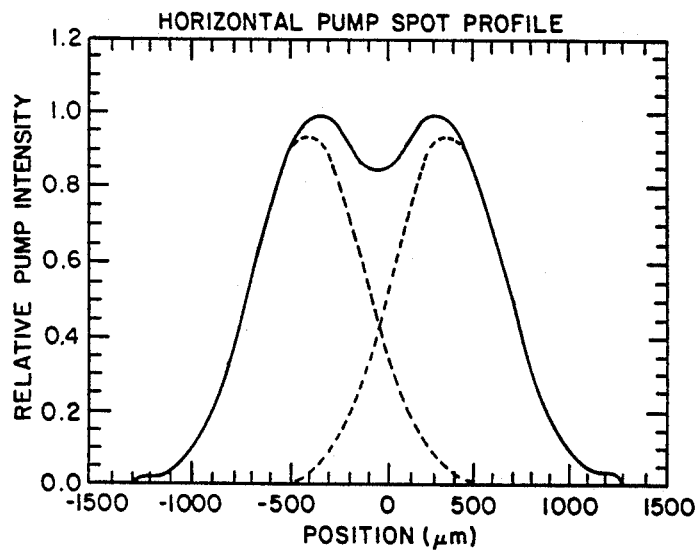
FIG. 4 illustrates the horizontal pump spot profile of the optical pump power as a function of position along the lateral axis passing through FOCAL POINT A.

The performance of the lens assembly 12, as shown in FIGS. 2A and 2B, is evaluated by first scanning a 500 μm aperture across the FOCAL POINT A spot focused by the optics (FIGS. 2A and 2B) from a laser diode, and then deconvolving the aperture function from this profile. FIG. 4 shows this deconvolved profile as well as a best-fit by a function consisting of the sum of two gaussian functions. The observed performance of the lens assembly 12 of FIGS. 2A and 2B agrees closely with the design expectations. The lens assembly 12 of FIGS. 2A and 2B focuses more than 80% of the output power from the laser diode bar 11 having a 1 cm aperture into two spots approximately 150 μm thick, approximately 680 μm wide and separated by approximately 730 μm. The depth-of-focus of each spot is approximately 1 mm. The discrepancies between expected and observed focusing properties are attributed to the deviation of the actual laser diode output from the idealized output assumed in the modeling. The ray-trace simulations suggest and the experimental observations confirm that the two spots are insufficiently resolved to attempt to overlap them exactly using, for example, a dihedral prism.

The system of the invention images in the large divergence direction, thus the average laser diode spatial distribution is reproduced at the focused spot (FOCAL POINT A), and the spot size is determined by the magnification ratio of the optics shown in FIGS. 2A and 2B. As the emitted beam from laser diode bar 11 is nearly diffraction-limited in the large-divergence direction, the spot size in this direction is limited primarily by the divergence direction (as shown in FIG. 2A), so the spatial distribution of the light at the focused spot in that direction corresponds to the far-field pattern of the laser diode bar, and is limited by the magnification ratio of the optics. Thus, further adjustment of the design of the optics (shown and described in relation to FIGS. 2A and 2B) will not improve the shape of the spot. However, the spot can be made smaller and more intense by increasing the diffraction-limited aperture of the optics and decreasing the magnification ratio of the optics in the system of the invention.

Figure 5:
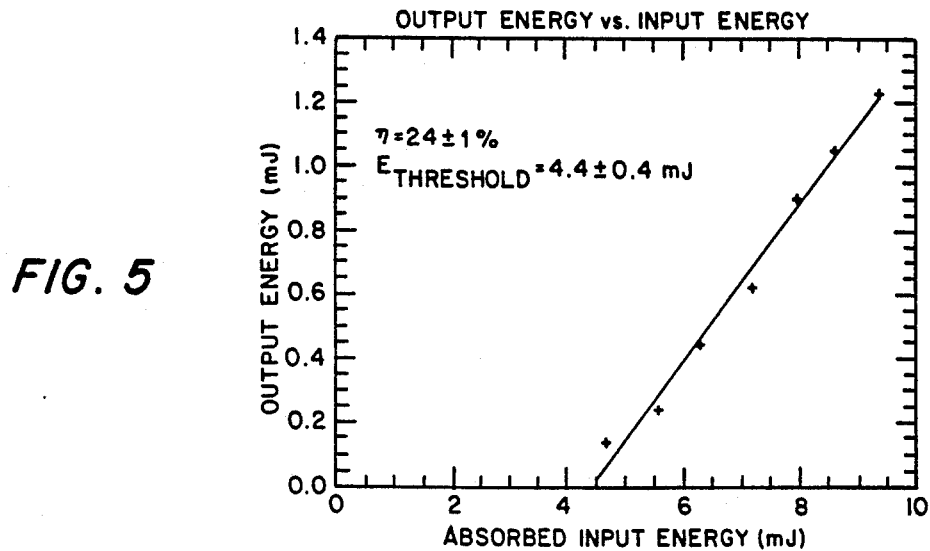
FIG. 5 illustrates an exemplary plot of the output energy of the $Tm^{3+}$:YAG laser of FIG. 1 as a function of the absorbed input energy derived from the optical energy focused at point A.

FIG. 5 illustrates an exemplary plot of the output energy of the $Tm^{3+}$:YAG laser of FIG. 1 as a function of the absorbed input energy derived from the optical energy focused at FOCAL POINT A (FIGS. 2A and 2B). The threshold is $4.4 \pm 0.4$ mJ and the slope efficiency is $24 \pm 1\%$. A maximum output energy of 1.3 mJ is produced from 9.36 mJ of absorbed energy.

The invention provides the following advantages:

1. Off-the-shelf optical parts in the lens assembly 32 (shown in FIGS. 2A and 2B) are preferably utilized on the basis of cost and availability. The lens assembly of FIGS. 2A and 2B, and the associated TABLE, use a progression of plano-convex cylindrical lenses in order of increasing focal lengths, followed by plano-convex spherical lenses in order of decreasing focal lengths in order to realize an optical system having a high numerical aperture and a short effective focal length.

2. It minimizes aberrations in the large-divergence direction (FIG. 2B). This approach is realistic because the small emitting aperture in the large-divergence direction (approximately 1 μm) renders a beam comparatively close to the diffraction limit.

3. It uses the shortest focal length optics practical in order to minimize spread in the low divergence direction (FIG. 2A).

4. It takes advantage of the two-lobe laser diode far-field pattern to obtain two spots (41 and 43 in FIG. 3) of higher intensity than possible without the two-lobe pattern. It specifically treats each laser diode in the laser diode bar 11 as if it is emitting two very narrow (approximately 2 degree) divergence beams (separated by approximately 6 degrees) rather than a single output beam having a larger divergence of approximately 8 degrees.

Therefore, what has been described in a preferred embodiment of the invention is a system for focusing the output bright light from an elongated area of a long aperture laser diode bar into a small, high intensity spot to end pump a solid state laser.

It should therefore readily be understood that many modifications and variations of the present invention are possible within the purview of the claimed invention. For example, any other type of active medium 14 could be utilized in the invention, such as a $Ho^{3+}$:YAG. While the invention is particularly useful in end-pumping 3-level lasers and self-terminating lasers, it could also be used to end-pump 4-level lasers. In addition, the optical system shown in FIGS. 2A and 2B could be replaced with a different set of optics such as, for example, by one or two compound lenses or even more than the 7 lenses shown in FIGS. 2A and 2B. However, such replacement lenses could be very expensive to fabricate. It is therefore to be understood that, within the scope of the appended claims, the invention may be practiced otherwise than as specifically described.

What is claimed and desired to be secured by Letters Patent of the United States is:

1. An optical system for end-pumping a gain medium containing active dopant ions in a resonant optical cavity of a solid state laser, said optical system comprising:
    laser pumping means for producing from an elongated area thereof at least a 10 watt output bright light with given lateral and transverse divergences; and
    optical means in proximity to said laser pumping means for focusing said output bright light into a relatively small high intensity spot at one end of said gain medium to end-pump said solid state laser.

2. The optical system of claim 1 wherein:
    said laser pumping means is pulsed to produce pulses of output bright light.

3. An optical system for end-pumping a gain medium containing active dopant ions in a resonant optical cavity of a solid state laser, said optical system comprising:
    laser diode pumping means for producing from an elongated area thereof an output bright light with given lateral and transverse divergences; and
    optical means in proximity to said laser diode pumping means for focusing said output bright light into a relatively small high intensity spot at one end of said gain medium to end-pump said solid state laser, and wherein:
    said solid state laser is a three-level laser.

4. An optical system for end-pumping a gain medium containing active dopant ions in a resonant optical cavity of a solid state laser, said optical system comprising:
    laser diode pumping means for producing from an elongated area thereof an output bright light with given lateral and transverse divergences; and
    optical means in proximity to said laser diode pumping means for focusing said output bright light into a relatively small high intensity spot at one end of said gain medium to end-pump said solid state laser, said optical means including:
    a plurality of cylindrical lenses to substantially collimate said output bright light; and
    a plurality of spherical lenses to focus said substantially collimated output bright light into said relatively small high intensity spot.

5. The optical system of claim 4 wherein:
    each of said plurality of cylindrical lenses and said plurality of spherical lenses is coaxially aligned in sequence with the other lenses.

6. The optical system of claim 4 wherein:
    said laser diode pumping means includes a laser diode bar containing a plurality of separate laser diode arrays.

7. An optical system for end-pumping a gain medium containing active dopant ions in a resonant optical cavity of a solid state laser, said optical system comprising:
    laser diode pumping means for producing from an elongated area thereof an output bright light with given lateral and transverse divergences; and
    optical means in proximity to said laser diode pumping means for focusing said output bright light into a relatively small high intensity spot at one end of said gain medium to end-pump said solid state laser, and wherein:
    said active dopant ions have physical properties such that the end-pumping of said solid state laser produces a stimulated emission corresponding to a three-level optical transition for said active dopant ions.

8. The optical system of claim 7 wherein:
    said active dopant ions are comprised of thulium.

9. The optical system of claim 7 wherein:
    said active dopant ions are comprised of holmium.

10. A laser system comprising:
    an active medium in a resonant optical cavity of a solid state laser;
    laser diode pumping means for emitting from an elongated emissive area thereof at least a 10 watt bright light having a lateral divergence and a transverse divergence; and
    optical means disposed between said laser diode pumping means and said solid state laser for focusing said bright light into a relatively small high intensity spot to end-pump said solid state active medium.

11. The laser system of claim 10 wherein:
    said laser diode pumping means is pulsed to produce pulses of bright light.

12. A laser system comprising:
    an active medium in a resonant optical cavity of a solid state;

laser diode pumping means for emitting from an elongated emissive area thereof a bright light having a lateral divergence and a transverse divergence; and optical means disposed between said laser diode pumping means and said solid state laser for focusing said bright light into a relatively small high intensity spot to end-pump said solid state active medium, said optical means including:

a large numerical aperture, compound cylindrical lens 27 to collimate the output bright light of said laser diode bar in said transverse direction; and a compound spherical lens to focus said collimated bright light into said relatively small high intensity spot.

13. A laser system comprising:

an active medium in a resonant optical cavity of a solid state;

laser diode pumping means for emitting from an elongated emissive area thereof a bright light having a lateral divergence and a transverse divergence; and optical means disposed between said laser diode pumping means and said solid state laser for focusing said bright light into a relatively small high intensity spot to end-pump said solid state active medium, said optical means including:

three circular-cylinder plano-convex lenses;
one spherical biconvex lens; and
three spherical plano-convex lenses.

14. A laser system comprising:

an active medium in a resonant optical cavity of a solid state;

laser diode pumping means for emitting from an elongated emissive area thereof a bright light having a lateral divergence and a transverse divergence; and optical means disposed between said laser diode pumping means and said solid state laser for focusing said bright light into a relatively small high intensity spot to end-pump said solid state active medium, said optical means including:

a plurality of cylindrical lenses to substantially collimate said bright light; and a plurality of spherical lenses to focus said substantially collimated bright light into said relatively small high intensity spot.

15. The laser system of claim 14 wherein:

said laser diode pumping means includes a laser diode bar containing a plurality of separate laser diode arrays.

16. A laser system comprising:

an active medium in a resonant optical cavity of a solid state;

laser diode pumping means for emitting from an elongated emissive area thereof a bright light having a lateral divergence and a transverse divergence; and optical means disposed between said laser diode pumping means and said solid state laser for focusing said bright light into a relatively small high intensity spot to end-pump said solid state active medium, said wherein:

said solid state laser is a three-level laser.

17. A laser system comprising:

an active medium in a resonant optical cavity of a solid state laser, said active medium including a host material containing active dopant ions, said active dopant ions having physical properties such that the end-pumping of said solid state laser produces a stimulated emission corresponding to a three-level optical transistion for said active dopant ions;

laser diode pumping means for emitting from an elongated emissive area thereof a bright light having a lateral divergence and a transverse divergence; and optical means disposed between said laser diode pumping means and said solid state laser for focusing said bright light into a relatively small high intensity spot to end-pump said solid state active medium.

18. The laser system of claim 17 wherein:
said active dopant ions are comprised of thulium.

19. The laser system of claim 17 wherein:
said active dopant ions are comprised of holmium.

* * * * *